United States Patent
Ayranci et al.

(10) Patent No.: US 11,152,907 B2
(45) Date of Patent: *Oct. 19, 2021

(54) OPTIMIZED MULTI GAIN LNA ENABLING LOW CURRENT AND HIGH LINEARITY INCLUDING HIGHLY LINEAR ACTIVE BYPASS

(71) Applicant: pSemi Corporation, San Diego, CA (US)

(72) Inventors: Emre Ayranci, Costa Mesa, CA (US); Miles Sanner, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 73 days.

This patent is subject to a terminal disclaimer.

(21) Appl. No.: 16/860,739

(22) Filed: Apr. 28, 2020

(65) Prior Publication Data

US 2020/0328724 A1 Oct. 15, 2020

Related U.S. Application Data

(63) Continuation of application No. 16/046,962, filed on Jul. 26, 2018, now Pat. No. 10,673,401, which is a
(Continued)

(51) Int. Cl.
*H03F 3/193* (2006.01)
*H03F 1/32* (2006.01)
(Continued)

(52) U.S. Cl.
CPC .......... *H03G 3/3036* (2013.01); *H03F 1/223* (2013.01); *H03F 1/3205* (2013.01); *H03F 3/193* (2013.01); *H03F 3/211* (2013.01); *H03F 3/72* (2013.01); *H03G 1/0023* (2013.01); *H03G 1/0029* (2013.01); *H03G 1/0088* (2013.01);
(Continued)

(58) Field of Classification Search
CPC .......... H03G 3/3036; H03G 2201/504; H03G 1/0029; H03G 3/001; H03G 1/0023; H03G 1/0088; H03G 3/3052; H03F 2203/7239; H03F 2200/156; H03F 2200/159; H03F 2200/492; H03F 2200/489; H03F 2200/61; H03F 2200/294; H03F 2200/451;
(Continued)

(56) References Cited

U.S. PATENT DOCUMENTS 8,330,547 B2 12/2012 Godbole
8,816,765 B2 8/2014 Rodal
(Continued)

OTHER PUBLICATIONS

Nguyen, Hieu P., Office Action received from the USPTO dated Jan. 8, 2018 for U.S. Appl. No. 15/479,173, 8 pgs.
(Continued)

*Primary Examiner* — Hieu P Nguyen
(74) *Attorney, Agent, or Firm* — Jaquez Land Greenhaus & McFarland LLP; John Land, Esq.

(57) ABSTRACT

An LNA having a plurality of paths, each of which can be controlled independently to achieve a gain mode. Each path includes at least an input FET and an output FET coupled in series. A gate of the output FET is controlled to set the gain of the LNA. Signals to be amplified are applied to the gate of the input FET. Additional stacked FETs are provided in series between the input FET and the output FET.

25 Claims, 7 Drawing Sheets

Related U.S. Application Data continuation of application No. 15/479,173, filed on Apr. 4, 2017, now Pat. No. 10,038,418.

(51) Int. Cl.
| | |
|---|---|
| *H03F 3/72* | (2006.01) |
| *H03F 1/22* | (2006.01) |
| *H03G 3/30* | (2006.01) |
| *H03G 1/00* | (2006.01) |
| *H03G 3/00* | (2006.01) |
| *H03F 3/21* | (2006.01) |

(52) U.S. Cl.
CPC ....... *H03G 3/001* (2013.01); *H03F 2200/156* (2013.01); *H03F 2200/159* (2013.01); *H03F 2200/294* (2013.01); *H03F 2200/451* (2013.01); *H03F 2200/489* (2013.01); *H03F 2200/492* (2013.01); *H03F 2200/61* (2013.01); *H03F 2203/7239* (2013.01); *H03G 3/3052* (2013.01); *H03G 2201/504* (2013.01)

(58) Field of Classification Search
CPC . H03F 3/72; H03F 1/223; H03F 3/211; H03F 3/193; H03F 1/3205
USPC ............. 330/295, 124 R, 285, 296, 283, 311
See application file for complete search history.

(56) References Cited

U.S. PATENT DOCUMENTS

| | | | |
|---|---|---|---|
| 9,035,697 B2 * | 5/2015 | Youssef | ................... H03F 3/211 |
| | | | 330/51 |
| 9,154,356 B2 * | 10/2015 | Tasic | ................... H04L 27/2647 |
| 9,419,565 B2 | 8/2016 | Nobbe et al. | |
| 10,038,418 B1 | 7/2018 | Ayranci et al. | |
| 10,673,401 B2 | 6/2020 | Ayranci et al. | |
| 2010/0237947 A1 * | 9/2010 | Xiong | ..................... H03F 1/223 |
| | | | 330/278 |
| 2019/0020322 A1 | 1/2019 | Ayranci et al. | |

OTHER PUBLICATIONS

Nguyen, Hieu P., Notice of Allowance received from the USPTO dated U.S. Appl. No. 15/479,173, 8 pgs.

Ayranci, et al., Response filed in the USPTO dated Apr. 9, 2018 for U.S. Appl. No. 15/479,173, 8 pgs.

Nguyen, Hieu P., Office Action received from the USPTO dated Aug. 30, 2019 for U.S. Appl. No. 16/046,962, 11 pgs.

Nguyen, Hieu P., Notice of Allowance received from the USPTO dated Jan. 21, 2020 for U.S. Appl. No. 16/046,962, 9 pgs.

PSEMI Corporation, Preliminary Amendment filed in the USPTO dated Oct. 9, 2018 for U.S. Appl. No. 16/046,962, 7 pgs.

PSEMI Corporation, Response filed in the USPTO dated Dec. 2, 2019 for U.S. Appl. No. 16/046,962, 10 pgs.

\* cited by examiner

OPTIMIZED MULTI GAIN LNA ENABLING LOW CURRENT AND HIGH LINEARITY INCLUDING HIGHLY LINEAR ACTIVE BYPASS

CROSS REFERENCE TO RELATED APPLICATIONS—CLAIM OF PRIORITY

This application is a continuation of commonly owned and co-pending U.S. patent application Ser. No. 16/046,962 filed Jul. 26, 2018, entitled "Optimized Multi Gain LNA Enabling Low Current and High Linearity Including Highly Linear Active Bypass", the disclosure of which is incorporated herein by reference in its entirety. U.S. application Ser. No. 16/046,962 is a continuation of commonly owned U.S. patent application Ser. No. 15/479,173 filed Apr. 4, 2017, entitled "Optimized Multi Gain LNA Enabling Low Current and High Linearity Including Highly Linear Active Bypass", now U.S. Pat. No. 10,038,418, issued Jul. 31, 2018, the disclosure of which is incorporated herein by reference in its entirety.

BACKGROUND

(1) Technical Field

This invention generally relates to low noise amplifiers (LNAs), and more specifically to solid state LNAs having low gain/low current modes with high linearity.

(2) Background

In many instances today, it is useful to have a radio frequency (RF) front end to receive and initially amplify signals. For example, within a communications receiver, an RF front end is typically provided that includes a low noise amplifier ("LNA"). The LNA is responsible for providing the first stage amplification to a signal received within the communications receiver. The operational specifications of the LNA are very important to the overall quality of the communications receiver. Any noise or distortion in the input to the LNA will get amplified and cause degradation of the overall receiver performance. Accordingly, the sensitivity of a receiver is, in large part, determined by the quality of the front end and in particular, by the quality of the LNA. Such front ends are frequently required to operate over a relatively broad dynamic range. That is, the signals received may at times be very weak and at other times, they may be very strong. The noise figure of the LNA determines the sensitivity (i.e., how weak a received signal can be and still be amplified with acceptable fidelity). The third order intercept (or other such measures of linearity) indicate how strong a received signal can be without non-linear components rising up to cause an unacceptable amount of distortion. Significant challenges arise in attempting to design a high performance LNA for use over such a wide dynamic range. That is, in order to provide such a high performance LNA, the gain of the LNA is preferably adjustable, including active bypass mode. In active bypass mode, the amplifier may provide either zero gain or negative gain (i.e., attenuation) while still providing an active buffer between the input and output of the front end. In addition, the noise figure, linearity, input impedance and output impedance preferably remain relatively constant as the gain changes. One way to accomplish this is to provide an amplifier with substantial gain that can be reduced. In amplifiers having wide dynamic range, the gain of the LNA is reduced when a relatively high-powered signal is received. Reducing the gain of the LNA reduces the risk that components within the rest of the receiver chain will become saturated. However, while the gain applied to the received signal can be reduced in several ways, there are typically drawbacks to each way.

In a conventional LNA configured as a cascode, the LNA is a two-stage amplifier having two transistors. The first is configured as a "common source" input transistor, e.g., input field effect transistor (FET). The second is configured in a "common gate" configuration as an output transistor, (e.g. output FET). By controlling the bias of the common gate FET, the gain of the LNA can be controlled. However, reducing the current by controlling the bias of the output FET typically places the FET in a non-linear state, thus reducing the linearity of the LNA as a whole. Furthermore, controlling the bias to reduce the current also tends to alter the impedance match at the input of the LNA. An impedance mismatch at the LNA input can cause significant distortion that will degrade the overall performance of the front end and more generally of the receiver.

Alternatively, attenuators can be used at various locations within the front end. However, it is difficult to achieve high linearity, good noise figure and desired power management goals when relying upon attenuators to control the gain of a front end LNA that needs to receive signals over a wide dynamic range.

It can be seen that there is currently a need for a front end LNA architecture suitable for use in situations in which the input to the front end is a signal having a relatively large dynamic range. The present invention meets this need.

SUMMARY OF THE INVENTION

A low noise amplifier (LNA) architecture is disclosed that comprises multiple groupings of transistors, such as field effect transistors (FETs) that can be selectively shut off when not required. A first FET within each grouping (or path) is configured as a "common source" input FET. A second FET within each path is configured as a "common gate" cascode output FET. In some embodiments, each path can further include additional FETs. Each path operates to provide a discrete amount of amplification. In some modes, the LNA operates in an active bypass mode, in which the LNA provides either zero gain or negative gain (i.e., attenuation). Switches are also used to configure the LNA to maintain a relatively consistent input and output impedance, to maintain a stable noise figure, current density through the active LNA components and linearity as paths are switched on and off.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 4 is an illustration of an LNA in which at least three paths, each have at least three FETs.

Like reference numbers and designations in the various drawings indicate like elements.

DETAILED DESCRIPTION OF THE INVENTION

Figure 1:
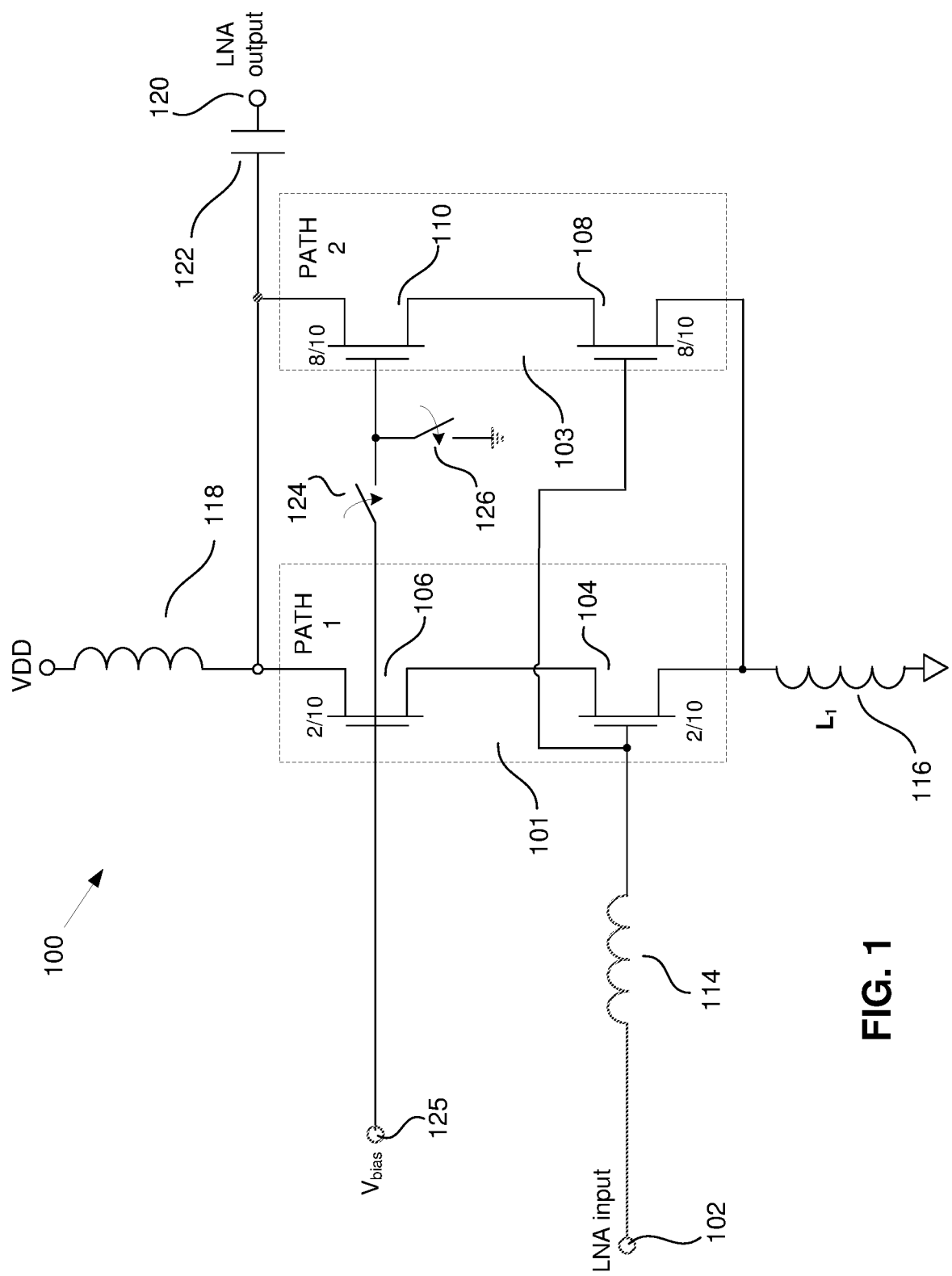
FIG. 1 is a simplified schematic of relevant components of a low noise amplifier (LNA) configured for use with inputs spanning a large dynamic range.

FIG. 1 is a simplified schematic of relevant components of a low noise amplifier (LNA) 100 configured for use with inputs spanning a large dynamic range. In some embodiments of the disclosed method and apparatus, an input port 102 is coupled to the LNA 100. The LNA 100 includes four transistors configured in two paths 101, 103, such as field effect transistors (FETs) 104, 106, 108, 110. The first FET 104 is configured as a "common source" input FET. The second FET 106 is configured as a "common gate" output FET (or "cascode" configured output FET). The first and second FETs 104, 106 are coupled in series to form the first path 101 of the LNA 100. The third FET 108 is also configured as a common source input FET. The gate of the third FET 108 is coupled directly to the gate of the first FET 104. The fourth FET 110 is configured as a common gate FET coupled in series with the third FET 108 (i.e., having its source coupled to the drain of the third FET 108). The third and fourth FETs 108, 110 form the second path 103 of the LNA 100. In some embodiments, other types of transistors may be used, including, but not limited to, bipolar junction transistors. Furthermore, any type of FET may be used to implement the LNA, including, but not limited to metal-oxide semiconductors (MOSFETs), junction field effect transistors (JFETs), insulated gate FETs (IGFETs), metal semiconductor FETs (MESFETs), etc. While some types of transistors may be better suited to particular applications, the concepts associated with the disclosed method and apparatus do not exclude the use of any particular type of transistor.

In accordance with some such embodiments, an input signal is applied to the input port 102. An inductive element, such as an inductor 114, couples the signal to the gates of the input FETs 104, 108. In some embodiments, a degeneration inductance, such as provided by inductor 116, is coupled between the source of the input FETs 104, 108 and ground. However, in other embodiments, the source of the FETs 104, 108 are coupled directly to ground. In some such embodiments, a conductor coupled from the source of the two FETs 104, 108 to ground provides sufficient inductance, eliminating the need for the inductor 116. A load inductance, such as inductor 118, is coupled between the LNA power supply VDD and the drains of the output FETs 106, 110. The output of the LNA 100 is taken from the source of the output FET 110 and coupled to an LNA output port 120 by an output matching circuit, which in the simplest embodiment is a capacitor 122.

A bias switch 124 allows the gate of the output FETs 110 to be coupled to the gate of the FET 106 and to a bias port 125. A bias voltage is applied through the bias port. When open, the bias switch 124 disconnects the gate of the FET 110 from the bias port 125. A gate/ground switch 126 is closed to pull the gate of the FET 110 to ground when it is not connected to the gate of the FET 106. The two switches 124, 126 may be operated together (i.e., controlled by the same control signal). Alternatively, each switch 124, 126 may be operated independently. Control signals for the switches are not shown for the sake of simplicity. However, it should be understood that each of the switches 124, 126 may be implemented by an FET switch in which the gate is coupled to a control signal source to cause the switch to open, or alternatively, to close. Accordingly, a selected gain mode can be achieved by setting the switches 124, 126. Alternatively, in some embodiments, an external bias control processor (not shown) provides a bias voltage directly to the gates of the FETs 106, 110 to achieve a selected gain mode. In such embodiments, the amount of bias provided (i.e., the particular voltage levels) can be controlled to alter some of the operating characteristics of the LNA 100 as may be appropriate for certain operating conditions, including selecting the gain mode. Decreasing the current by controlling the bias voltage enables current savings without negatively impacting the impedance match between the LNA and the circuits to which the LNA is connected, the noise figure, the gain and the linearity of the LNA. However, at some point, one or more of these factors will be negatively impacted.

In some embodiments, the switches 124, 126 are preferably not closed at the same time (i.e., the two switches are preferably operated in "break-before-make" mode). Having both switches 124, 126 closed at the same time will short the cascode gate voltage (Vbias) to ground. Once the short is released, it generally takes time for the gate voltage to charge back up and return to its nominal operating value. This may cause a disturbance to the RF performance of the amplifier, and thus to a degradation of the receiver performance until the bias voltage returns to the nominal operating value.

In contrast, the contacts of the switch 422 preferably operate in a "make-before-break" mode, such that there is always a path for the bias current to ground through inductor 416. Cutting off the path for the bias current can alter the RF performance of the amplifier until the DC bias can stabilize.

In some embodiments of the disclosed method and apparatus, the FETs 104, 106 of the first path 101 are essentially the same size. However, the FETs 108, 110 of the second path 103 are significantly larger than the FETs 1014, 106 of the first path 101. In some such embodiments, the ratio of the size of the FETs 104, 106 of the first path 101 to the size of the FETs 108, 110 of the second path 103 is such that when both paths are on, $^{2}/_{10}$ of the current flows through the first path and $^{8}/_{10}$ of the current flows through the second path 103. This is noted in the figure by marking the FETs as $^{2}/_{10}$ or $^{8}/_{10}$. Accordingly, the first path 101 is said to have a "path weight" of $^{2}/_{10}$ and the second path 103 has a path weight of $^{8}/_{10}$.

By setting the bias voltage (i.e., using the switch 124 to disconnect the gate of the FET 110 from the bias voltage and setting switch 126 to pull the gate to ground), the current through the second path 103 of the LNA is essentially turned off. Therefore, the output FET 110 will not conduct and no current will flow through the second path 103. Shutting off the second path 103 of the LNA 100, implements a low gain mode in which the gain of the LNA 100 is reduced without changing the current that flows through the two FETs 104, 106 of the first path 101 of the LNA 100. This scheme allows selection of a gain mode, wherein the LNA to be operated in a low gain mode in which the input impedance, noise figure and linearity of the LNA are minimally affected by operation in the low gain mode. Concurrently, the current consumption of the LNA 100 is reduced when at least one of the paths of the LNA are "shut off". Selection of the particular path weight of the paths that are conducting can be used to control the gain, current consumption, output power and linearity of the LNA. In addition, selection of the gain mode (i.e., which particular paths that are conducting) allows trade-offs to be made between parameters, such as gain, linearity and current consumption, etc. In some embodiments, the low gain mode is an active bypass mode in which the gain is either zero or negative.

This configuration can be expanded in two dimensions. That is, in some embodiments, additional paths can be added to expand the LNA in a first dimension. In addition to additional paths, additional FETs can be provide in each path, expanding the LNA in a second dimension. Adding additional paths provides greater flexibility and control of the gain of the LNA. Adding additional FETs to each path increases the ability of each path to withstand higher voltages from VDD to ground.

Figure 2:
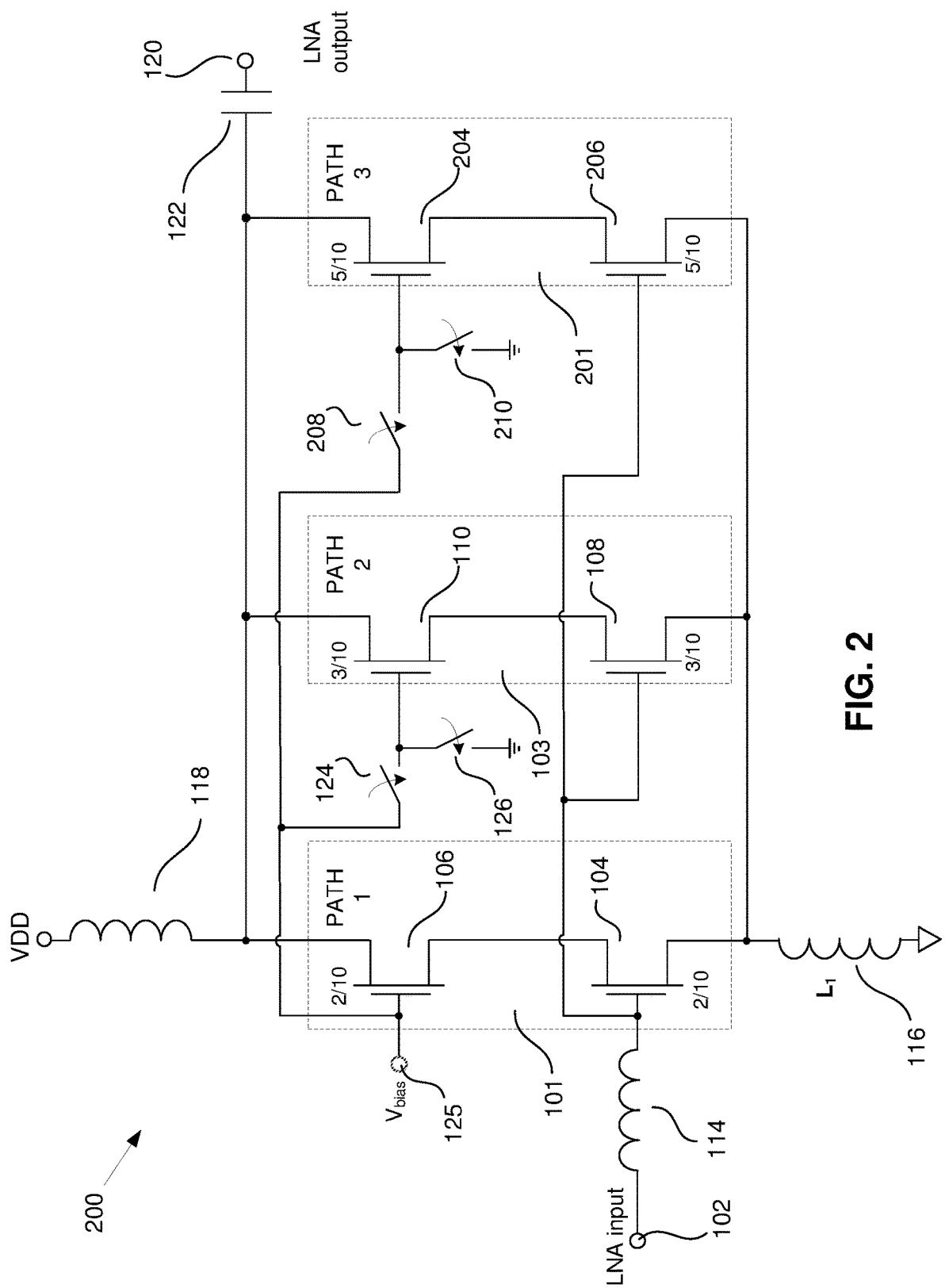
FIG. 2 is an illustration of a configuration of an LNA having a third path.

FIG. 2 is an illustration of a configuration of an LNA 200 having a third path 201. It should be understood that while FIG. 2 shows three paths 101, 103, 201, several more paths can be added to the LNA 200. The FETs 204, 206 of the additional path 201 can either be the same size as the FETs 104, 106 of the first path 101 or the FETs 108, 110 of the second path 103. Alternatively, the FETs 204, 206 of additional paths can be of different sizes to allow for a greater range in the gain that can be provided by the LNA 200. The additional paths 103, 201 can be activated independently, such that each path is turned on in additional to, or in place of, those that were previously turned on.

Figure 3:
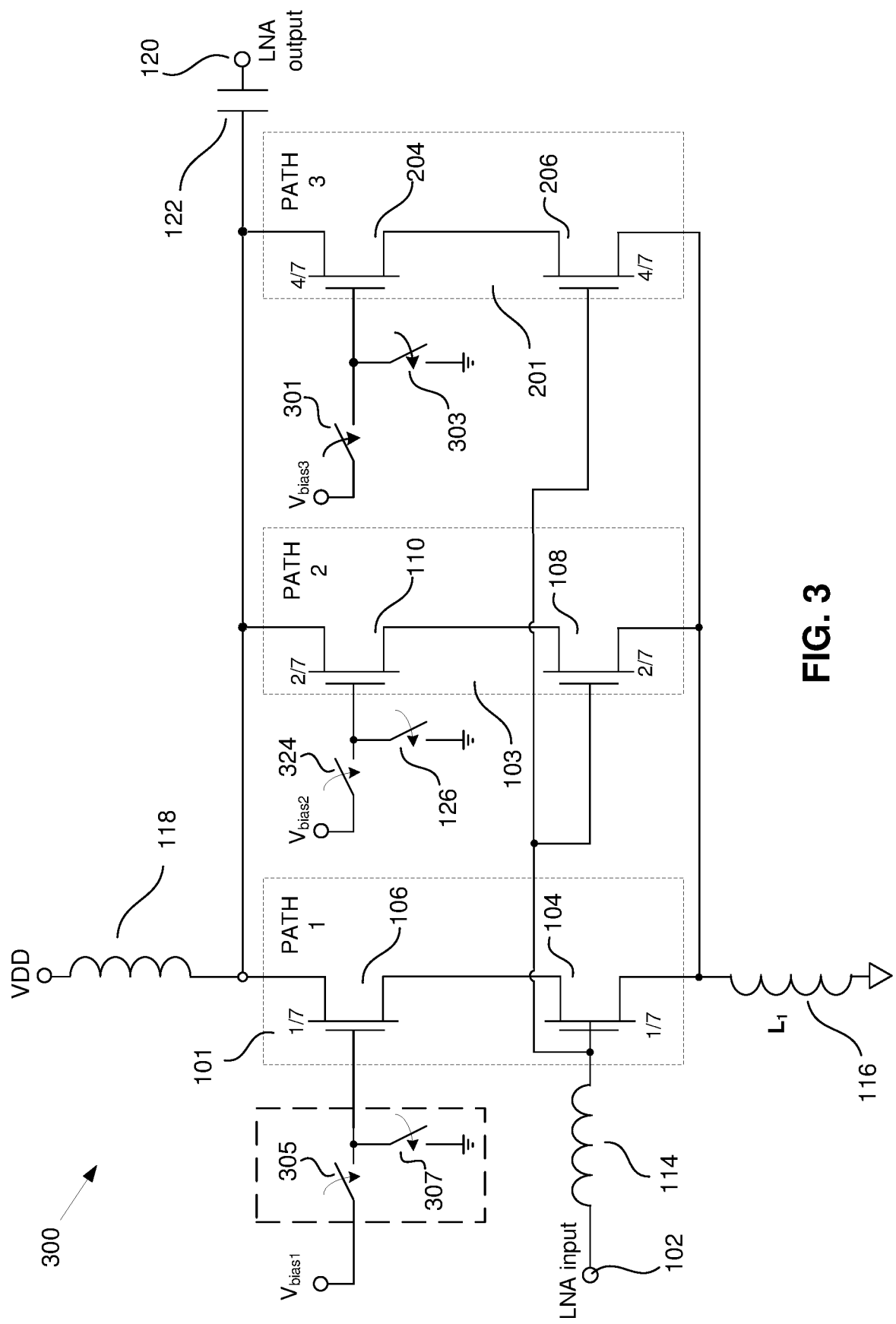
FIG. 3 is an illustration of another embodiment of an LNA in which a bias voltage is coupled to each path.

FIG. 3 is an illustration of another embodiment of an LNA 300 in which a bias voltage is coupled to each path 101, 103, 201. Each bias voltage is coupled to the corresponding output FET 106, 110, 204 independently. In some embodiments, a different bias ($V_{bias1}$, $V_{bias2}$, $V_{bias3}$) is applied to the gate of each FET 106, 110, 204. In some embodiments, a bias voltage is always applied to the first path 101. In such embodiments, the bias switch 305 and gate/ground switch 307 are not provided. The state of each bias switch 305, 324, 301 determines whether the corresponding path 101, 103, 201 is active. In some such embodiments, control of the bias voltage is handled by a bias control processor (not shown). In such embodiments, the bias switches 305, 324, 301 and gate/ground switches 305, 126, 303 may also not be necessary. Alternatively, the same bias voltage ($V_{bias1}$) is applied to each and the switches 305, 307, 324, 126, 301, 303 control which paths 101, 103, 201 will be conducting.

In some embodiments, different path weights (i.e., different sized FETs) in each path can be used. Accordingly, turning on paths having different weights provides maximum flexibility in the total current of the LNA 200 and so flexibility in the total gain of the LNA 200. For example, in the case in which there are three paths, the second path 103 could have a weight (i.e., FETs 108, 110 have relative size) that is twice the weight of the first path 101 (i.e., first path 101 has weight of 1/7, second path 103 has weight of 2/7). The third path 201 could have a weight of 4/7 that is twice that of the second path 103. Therefore, by allowing all combinations of the three paths to be possible, 7 different gain modes can be selected (noting that at least one path must be turned on for the LNA 200 to be operational). Any number of paths are possible, including 2 to 6 such paths or more.

Figure 4A:
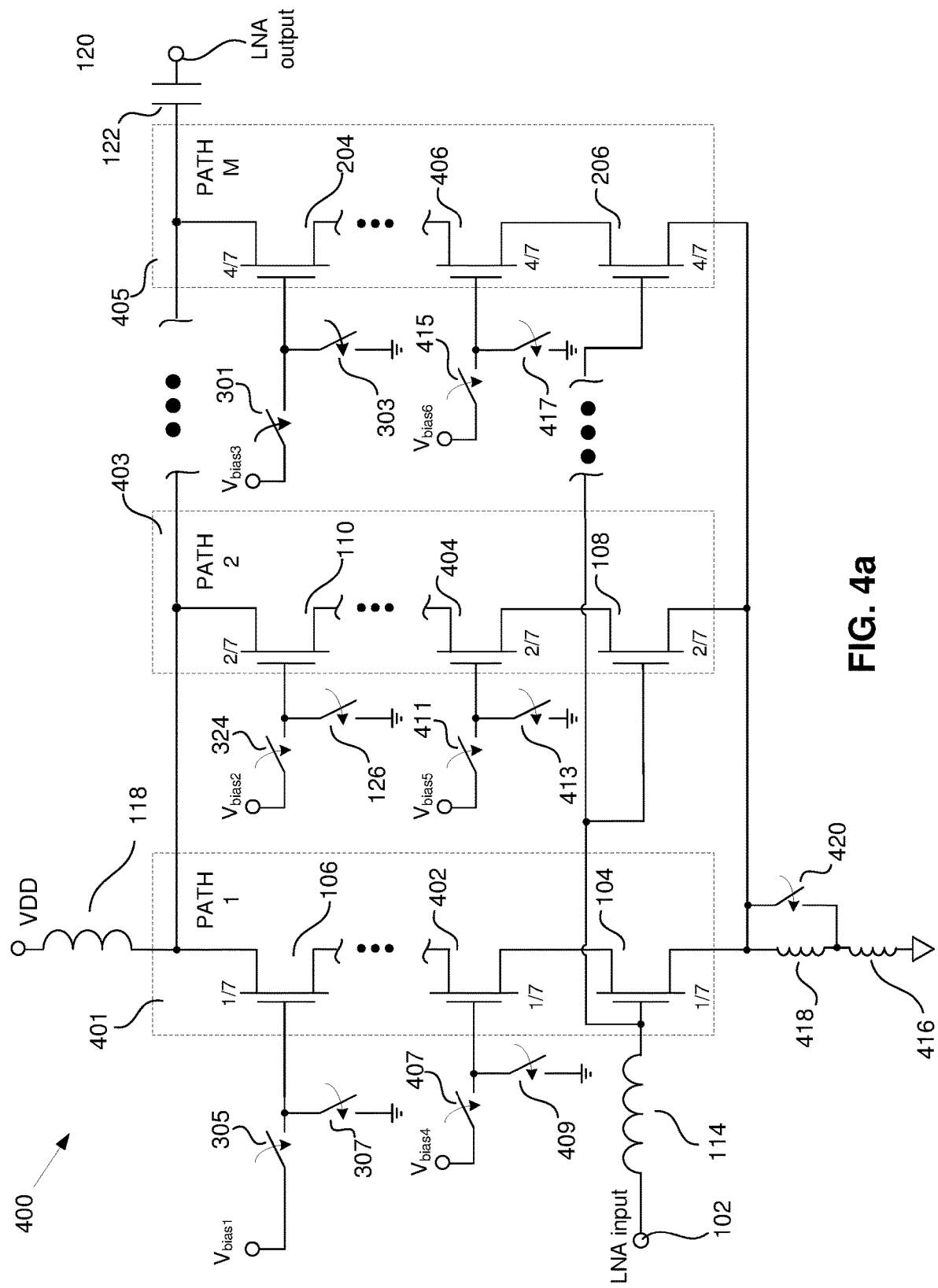
FIG. 4a is an illustration of an LNA in which at least three paths each have at least three FETs.

FIG. 4a is an illustration of an LNA 400 in which at least three paths 401, 403, 405 each have at least three FETs. Looking at the first path 401, a stacked FET 402 is connected with the drain coupled to the source of the output FET 106 and the source of the stacked FET 402 coupled to the drain of the input FET 104. In alternative embodiments, any number of additional stacked FETs may be laid in series with the three FETs 106, 402, 104 coupled in a manner similar to that of the stacked FET 402. Similar to the first path 401, each other path 403, 405 has at least one stacked FET 404, 406.

The gate of each of the stacked FETs 402, 404, 406 can be coupled to a bias voltage through a bias switch 407, 411, 415. When the bias switch is open, an associated gate/ground switch 409, 413, 417 can pull the gate to ground. Alternatively, each bias switch can be coupled to a common bias voltage source. In yet other embodiments, the bias to each of the gates of the output FETs 106, 110, 204 and the stacked FETs 402, 404, 406 can be controlled by a bias control processor. In some such embodiments, the bias switches 407, 411, 415 and associated gate/ground switches 409, 413, 417 are not provided. In some embodiments, the stack height (i.e., number of stacked FETs) in each path will depend upon the dimensions (e.g., gate length and oxide thickness, etc.) of and characteristics (i.e., technology used to fabricate the FETs) of each of the FETs in the path, the power levels of the LNA and the magnitude of the voltage between VDD and ground. That is, as the gate length and oxide thickness are reduced with newer generation technologies, the voltage handling capability of each FET is reduced. Increasing the number of stacked FETs offsets this trend and allows the LNA to support the same voltage and power levels. In some embodiments, there are 6 FETs stacked in each path (i.e., four stacked FETs, the input FET and the output FET). Similarly, the number of paths will depend upon the gain control that is desired. In some embodiments, there are six paths. Any combination of number of paths and number of stacked FETs is within the scope of the contemplated and disclosed method and apparatus. The particular selection of the number of each will depend upon the particular requirements that will be placed on the LNA.

In addition, two degeneration inductors 416, 418 are coupled in series between the source of the input FETs 104, 108, 206. A degeneration inductor switch 420 can be closed to reduce the degeneration inductance by shorting one of the inductors 418 in different gain modes. Additional inductors can be provided with additional switches to select the amount of degeneration inductance when there are several paths 401, 403, 405 and accordingly, several gain modes that can be selected. In some embodiments, the degeneration inductor switch 420 can be connected to a tap within a single inductor, rather than having two discrete inductors 416, 418. Alternatively, several switches coupled to several different taps on the inductor can be provided. In some embodiments, one or both of the inductances 416, 418 can be provided by the inductance of routing traces between the sources of the input FETs 104, 108, 206 and ground. In such embodiments, the bypass switch 420 shortens the distance between the sources and ground when closed.

Figure 4B:
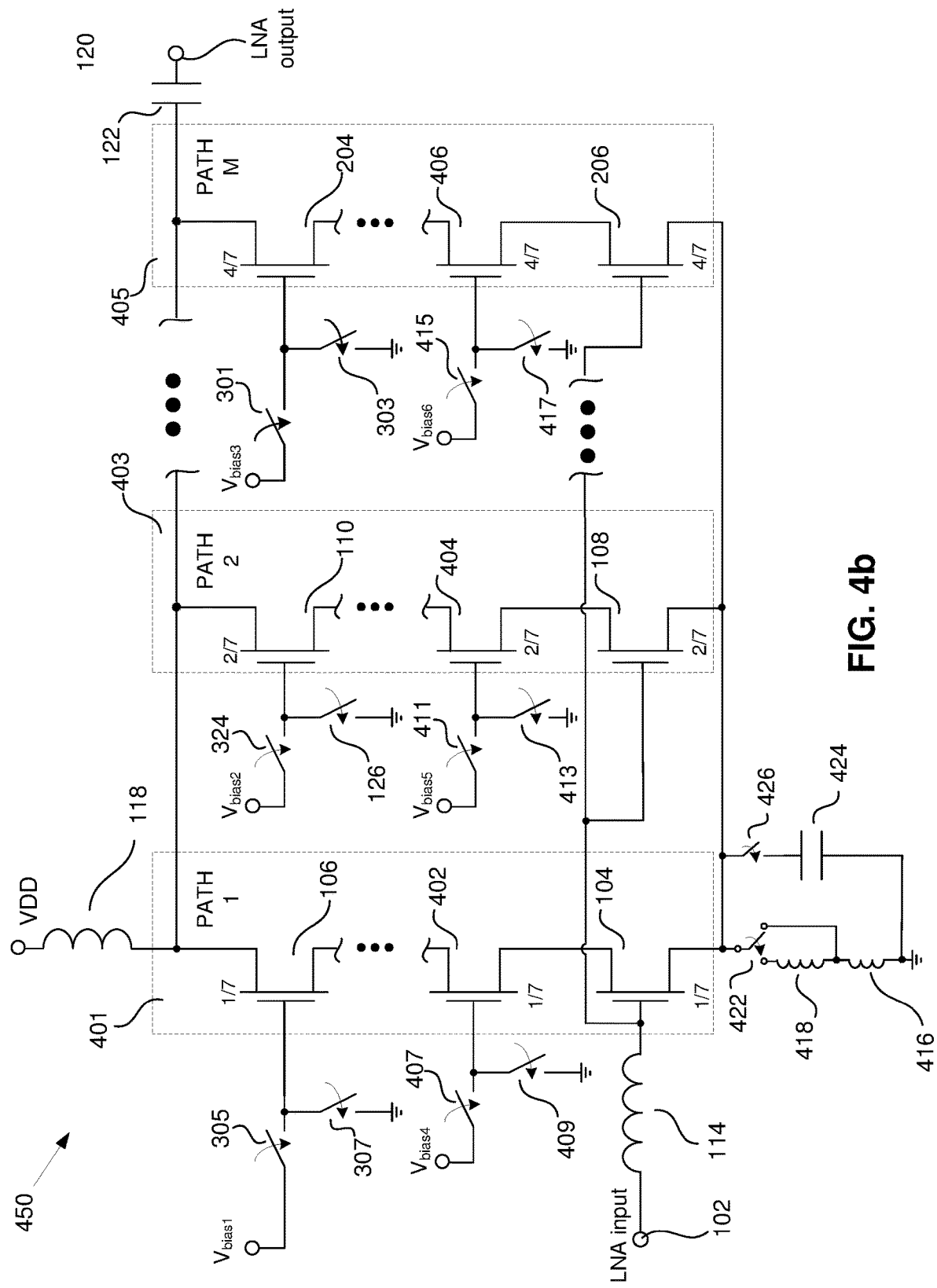
FIG. 4b is an illustration of an LNA that is similar to the LNA of FIG. 4a, however, a single pole, double throw switch is used rather than a single pole, single throw switch to control the configuration of the degeneration inductor.

FIG. 4b is an illustration of an LNA 450 that is similar to the LNA 400. However, a single pole, double throw switch 422 is used rather than a single pole, single throw switch 420. Accordingly, when the inductor 416 is to be used alone, the inductor 418 is disconnected by the switch 422. Disconnecting the inductor 418 can reduce coupling and loss in the unused inductor 418. In addition, a capacitor 424 is coupled in series with a switch 426. When the switch is closed, the capacitor 424 is placed in parallel with the degeneration inductors 416, 418. Closing the switch 426 to place the capacitor 424 in parallel with the degeneration inductor 416, 418 increases the effective degeneration inductance.

Figure 5:
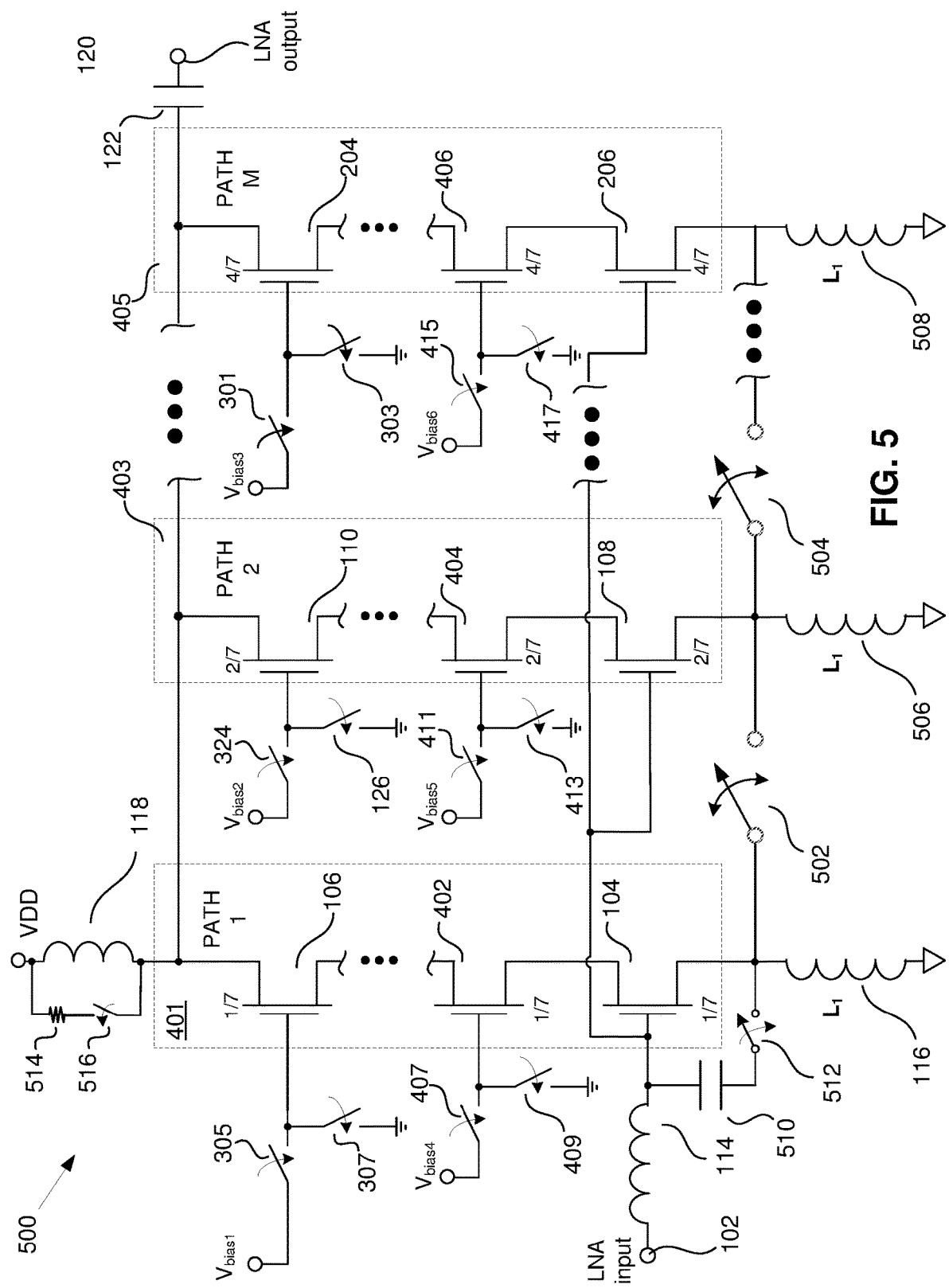
FIG. 5 is an illustration of an LNA that uses a number of paths and stacked FETs within the LNA with source switching.

FIG. 5 is an illustration of an LNA 500 that uses a number of paths and stacked FETs within the LNA 500, wherein the source of each of the input FETs 104, 108, 206 can be disconnected from the source of the other input FETs. One of the effects of turning off the current that flows through a path of the LNA 500 is that the capacitance from gate to source $C_{gs}$ of the FETs that are not conducting decreases. The decrease in the $C_{gs}$ of those input FETs that are not conducting will affect the input impedance of the LNA 500. Accordingly, the LNA 500 has source switches 502, 504 that allow the connection between the source of each of the input FETs 104, 108, 206 to be selectively closed when an input FET 104, 108, 206 is not conducting. When the input FET 104, 108, 206 is conducting, the source switch 502, 504 can be opened so each conducting input FET is coupled to a separate inductance coupled to the source of that FET. However, when the input FET is not conducting, the source switch is closed to place the $C_{gsoff}$ (i.e., the lower $C_{gs}$) in parallel with the $C_{gson}$ (i.e., the higher $C_{gs}$) of the conducting input FETs. Opening and closing the source switches 502, 504 makes the input impedance of the LNA 500 more consistent as paths are turned on and off.

In addition, an additional capacitive element, such as capacitor 510, and an associated cap switch 512 provide a means to compensate for the lower $C_{gs}$ when the input FET is not conducting. Thus, closing the cap switch 512 places the additional capacitance 510 in parallel with the Cgs of the conducting input FETs, thereby establishing a total capacitance that is the same for any combination of paths of the LNA 500 that are turned on or off. Additional capacitors 510 and cap switches 512 can be provided in association with each path of the LNA 500. Additional switches (not shown) may be provided to disconnect the degeneration inductances, such as inductors 504, 506, from the source of an FET that is not conducting to maintain a consistent input impedance. In addition, one or more of the inductors 116, 506, 508 of the LNA 500 can be replaced with two or more serially connected inductors and a degeneration inductor switch, such as shown in FIG. 4 and discussed above with respect to the LNA 400. It should be noted that a source switches 502, additional inductors 506, capacitor 510 and cap switch 512 can also be used with the LNA 100 of FIG. 1. Additional information regarding using source switched splitting is provided in copending U.S. application Ser. No. 15/342,016 which is hereby incorporated by reference.

Still further, at least one de-Qing resistance 514 and associated de-Q bypass switch 516 can be coupled in series between VDD and the drain of the FETs 106, 110, 204. Additional de-Qing resistances and associated bypass switches (not shown) can be added to provide greater flexibility in the selection of the resistance to be placed in parallel with the load inductance 118.

Figure 6:
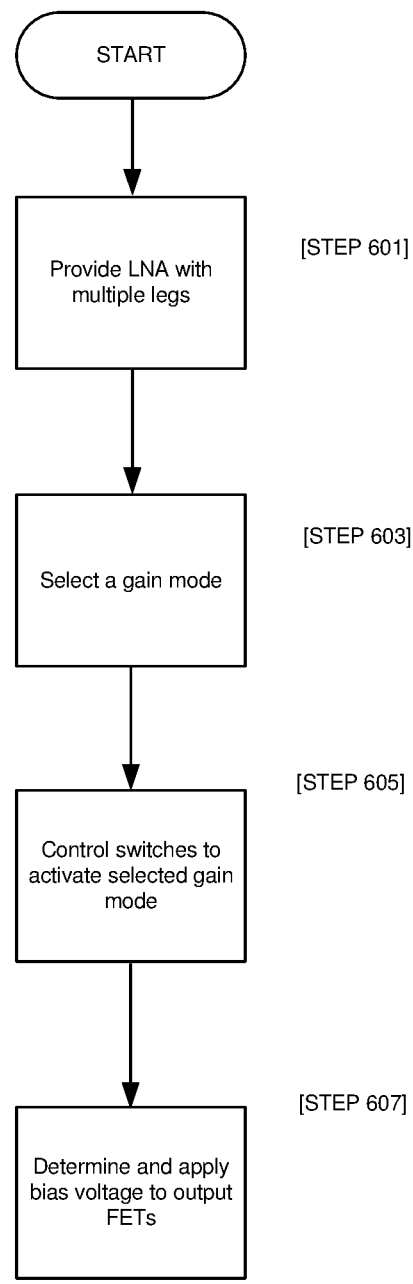
FIG. 6 is a flowchart of a method in accordance with some embodiments for amplifying signals using an LNA having a low gain mode with low current consumption and high linearity.

FIG. 6 is a flowchart of a method in accordance with some embodiments for amplifying signals using an LNA 100 having a low gain mode with low current consumption and high linearity. The method in accordance with one embodiment includes providing an LNA 100 having a plurality of paths 101, 103 comprising at least an input FET 104, 108 and an output FET 106, 110 (STEP 601). The method further includes selecting a gain mode from at least two available gain modes (STEP 603). At least one switch bias switch 124 is controlled to activate the selected gain mode (STEP 605).

In some embodiments, selection of the gain mode may also include determining the bias voltage to apply to the bias port 125 (STEP 607).

As should be readily apparent to one of ordinary skill in the art, various embodiments of the invention can be implemented to meet a wide variety of specifications. Thus, selection of suitable component values is a matter of design choice (so long as the frequencies of interest mentioned above can be handled). The switching and passive elements may be implemented in any suitable integrated circuit (IC) technology, including but not limited to MOSFET and IGFET structures. Integrated circuit embodiments may be fabricated using any suitable substrates and processes, including but not limited to standard bulk silicon, silicon-on-insulator (SOI), silicon-on-sapphire (SOS), GaAs pHEMT, and MESFET processes. Voltage levels may be adjusted or voltage polarities reversed depending on a particular specification and/or implementing technology (e.g., NMOS, PMOS, or CMOS). Component voltage, current, and power handling capabilities may be adapted as needed, for example, by adjusting device sizes, "stacking" components to handle greater voltages, and/or using multiple components in parallel to handle greater currents.

A number of embodiments have been described. It is to be understood that various modifications may be made without departing from the spirit and scope of the claimed invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:

1. A low noise amplifier (LNA) comprising:
   (a) a plurality of parallel-coupled cascode amplifiers, each having an input, an output, a bias port, and a source terminal and configured to receive an input signal on the input and generate an output signal having a selectable gain on the output;
   (b) a first inductance coupled to the output of each of the plurality of parallel-coupled cascode amplifiers and configured to be coupled to a power supply;
   (c) a second inductance coupled to the source terminal of each of the plurality of parallel-coupled cascode amplifiers and configured to be coupled to ground; and
   (d) for at least one of the plurality of parallel-coupled cascode amplifiers, a corresponding first switch coupled between a bias voltage source and the bias port, and a corresponding second switch coupled between ground and the bias port;
   wherein the bias port of at least one of the plurality of parallel-coupled cascode amplifiers is selectively couplable to one of a bias voltage source through the corresponding first switch or to ground through the corresponding second switch.

2. The invention of claim 1, wherein at least a first cascode amplifier and a second cascode amplifier of the plurality of parallel-coupled cascode amplifiers are of significantly different current carrying sizes.

3. The invention of claim 1, wherein the selectable gain on the outputs of the plurality of parallel-coupled cascode amplifiers is set to a lower gain mode or to a higher gain mode as a function of the number of bias ports of the cascode amplifiers coupled to ground versus coupled to the power supply.

4. The invention of claim 1, wherein the second inductance has a selectable value.

5. The invention of claim 4, wherein the selectable value of the second inductance is a function of the selectable gain.

6. The invention of claim 1, wherein the bias ports of at least two cascode amplifiers of the plurality of parallel-coupled cascode amplifiers are selectively couplable to separate respective bias voltage sources.

7. The invention of claim 1, further including one or more source switches each coupled between the source terminals of respective pairs of the plurality of parallel-coupled cascode amplifiers.

8. The invention of claim 7, wherein an OPEN or CLOSED state of each source switch is a function of the selectable gain.

9. The invention of claim 1, further including a selectable resistance coupled in parallel with the first inductance.

10. The invention of claim 9, wherein selection of a state for the selectable resistance is a function of the selectable gain.

11. The invention of claim 1, further including a selectable capacitance coupled in parallel with the second inductance.

12. The invention of claim 11, wherein selection of a state for the selectable capacitance is a function of the selectable gain.

13. A low noise amplifier (LNA) comprising:
(a) a plurality of parallel-coupled cascode amplifiers, each having an input, an output, a bias port, and a source terminal and configured to receive an input signal on the input and generate an output signal having a selectable gain on the output;
(b) a plurality of degeneration inductances, each coupled to the source terminal of a corresponding one of the plurality of parallel-coupled cascode amplifiers and configured to be coupled to ground; and
(c) one or more source switches each coupled between the source terminals of respective pairs of the plurality of parallel-coupled cascode amplifiers;
wherein the bias port of at least one of the plurality of parallel-coupled cascode amplifiers is selectively couplable to one of a bias voltage source or to ground.

14. The invention of claim 13, wherein at least a first cascode amplifier and a second cascode amplifier of the plurality of parallel-coupled cascode amplifiers are of significantly different current carrying sizes.

15. The invention of claim 13, wherein the selectable gain on the outputs of the plurality of parallel-coupled cascode amplifiers is set to a lower gain mode or to a higher gain mode as a function of the number of bias ports of the cascode amplifiers coupled to ground versus coupled to the power supply.

16. The invention of claim 13, wherein the at least one of the plurality of degeneration inductances has a selectable value.

17. The invention of claim 16, wherein the selectable value of the at least one of the plurality of degeneration inductances is a function of the selectable gain.

18. The invention of claim 13, wherein the bias ports of at least two cascode amplifiers of the plurality of parallel-coupled cascode amplifiers are selectively couplable to separate respective bias voltage sources.

19. The invention of claim 13, wherein an OPEN or CLOSED state of each source switch is a function of the selectable gain.

20. The invention of claim 13, further including a selectable capacitance coupled in parallel with a corresponding one of the at least one of the plurality of degeneration inductances.

21. The invention of claim 20, wherein selection of a state for the selectable capacitance is a function of the selectable gain.

22. The invention of claim 13, further including a load inductance coupled to the output of each of the plurality of parallel-coupled cascode amplifiers and configured to be coupled to a power supply.

23. The invention of claim 22, further including a selectable resistance coupled in parallel with the load inductance.

24. The invention of claim 23, wherein selection of a state for the selectable resistance is a function of the selectable gain.

25. A low noise amplifier (LNA) comprising:
(a) a plurality of parallel-coupled cascode amplifiers, each having an input, an output, a bias port, and a source terminal and configured to receive an input signal on the input and generate an output signal having a selectable gain on the output;
(b) one or more source switches each coupled between the source terminals of respective pairs of the plurality of parallel-coupled cascode amplifiers;
(c) a plurality of degeneration inductances, each coupled to the source terminal of a corresponding one of the plurality of parallel-coupled cascode amplifiers and configured to be coupled to ground; and
(d) a load inductance coupled to the output of each of the plurality of parallel-coupled cascode amplifiers and configured to be coupled to a power supply;
wherein the bias port of at least one of the plurality of parallel-coupled cascode amplifiers is selectively couplable to one of a bias voltage source or to ground; and
wherein the selectable gain on the outputs of the plurality of parallel-coupled cascode amplifiers is set to a lower gain mode or to a higher gain mode as a function of the number of bias ports of the cascode amplifiers coupled to ground versus coupled to the power supply.

* * * * *